United States Patent [19]

Halon

[11] 4,375,385
[45] Mar. 1, 1983

[54] PLASMA ETCHING OF ALUMINUM

[75] Inventor: Bernard Halon, Brooklyn, N.Y.

[73] Assignee: RCA Corporation, New York, N.Y.

[21] Appl. No.: 362,044

[22] Filed: Mar. 25, 1982

[51] Int. Cl.³ .............................................. C23F 1/02
[52] U.S. Cl. .................................... 156/643; 156/646;
156/659.1; 156/665; 204/192 E; 252/79.1
[58] Field of Search ............ 156/643, 646, 656, 659.1,
156/665, 345; 204/164, 192 E, 298; 250/531;
427/38, 39; 252/79.1

[56] References Cited

U.S. PATENT DOCUMENTS 4,073,669 2/1978 Heinecke et al. .................... 156/643
4,148,705 4/1979 Battey et al. .................... 156/643 X
4,243,506 1/1981 Ikeda et al. .................... 156/643 X
4,333,793 6/1982 Lifshitz et al. ............... 156/659.1 X
4,337,132 6/1982 Jones ............................. 156/643 X Primary Examiner—William A. Powell
Attorney, Agent, or Firm—Birgit E. Morris; R. Hain Swope

[57] ABSTRACT

A method of improving uniformity of etching in the plasma etching of a substrate of aluminum and its alloys by supporting the substrate on a getter plate of a metal such as tantalum. The getter plate extends beyond the substrate for a distance sufficient to improve the uniformity of etching across the substrate.

9 Claims, 1 Drawing Figure

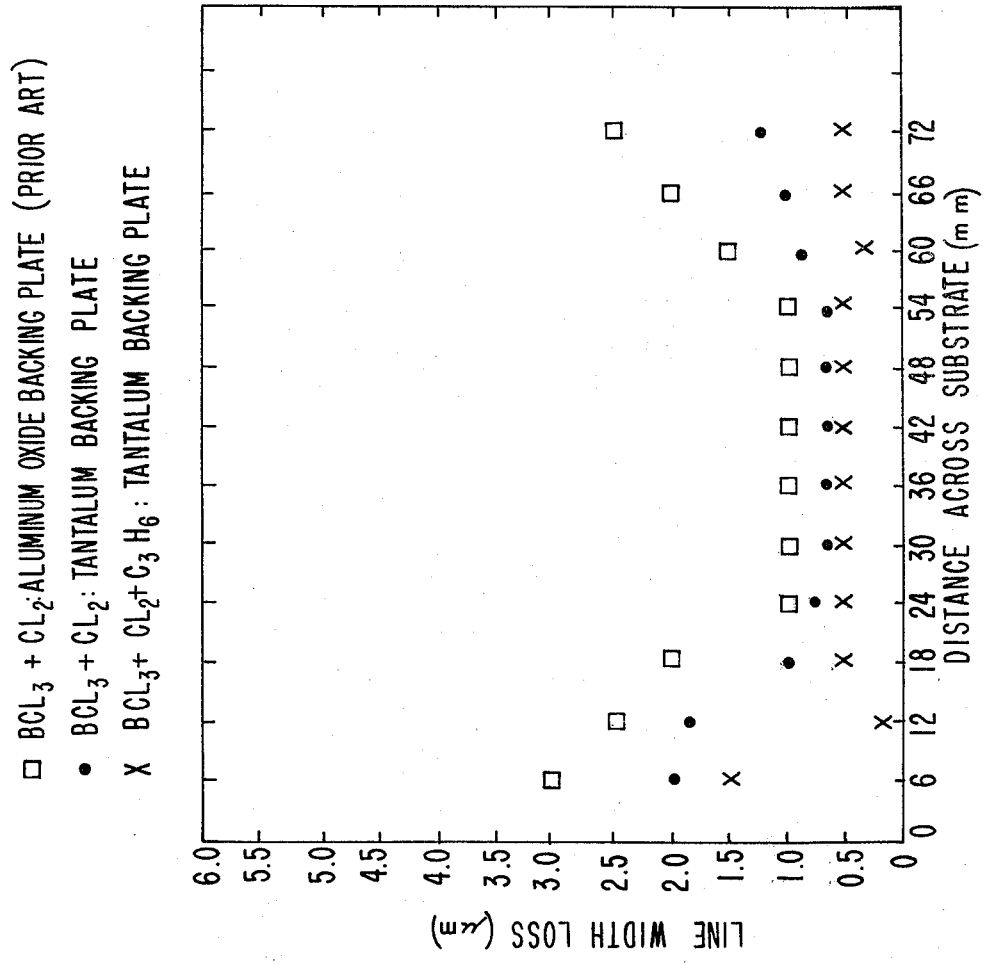

PLASMA ETCHING OF ALUMINUM

This invention relates to the plasma etching of aluminum and its alloys. More particularly, this invention pertains to a method of improving the uniformity of the etch across the substrate by controlling the rate of feed of reactive species to local regions of the substrate.

BACKGROUND OF THE INVENTION

The importance of etching aluminum and its alloys has increased significantly within the last several years. As the electronics industry has moved into production of very large scale integrated circuits (VLSI), the need for methodology which meets the requirements for VLSI production has become increasingly acute.

The high-density, i.e. fine-line, geometries necessary for VLSI circuits make it essential that etching is anisotropic to achieve faithful delineation of patterns. It is likewise important that the etch be as uniform as possible over the entire surface of a substrate. Merely carrying out the etch for a time sufficient for all of the substrate to be etched is not the solution to uniformity, however, since this would result in overetching in the peripheral regions of the substrate. Those of ordinary skill in the art are aware of the fact that, in the etching of aluminum for VLSI production, overetching is as disadvantageous as underetching. A method of significantly improving the uniformity of etch across a substrate is provided in accordance with this invention.

SUMMARY OF THE INVENTION

A method of improving the uniformity of a plasma etch across an aluminum substrate by using as a support plate for the substrate a gettering material for reactive ions present, such as tantalum, the support plate having dimensions greater than those of the substrate.

BRIEF DESCRIPTION OF THE DRAWING

The FIGURE is a plot of loss of line width in the plasma etching of aluminum versus distance across a substrate using the method according to this invention compared to a control.

DETAILED DESCRIPTION OF THE INVENTION

This invention is directed to improving the anisotropic quality of plasma etching of aluminum. Generally, plasma etching is believed to include the following five steps:

(a) reactive gaseous atoms are produced in the glow discharge by dissociation of the etchant gas;

(b) the reactive gaseous atoms are adsorbed onto the surface being etched;

(c) the adsorbed reactive gaseous atoms are excited by ion bombardment;

(d) the excited atoms react with surface atoms to form volatile compounds; and (e) the volatile compounds are desorbed by heat and/or ion bombardment and are pumped away.

The etching reaction is continued until the aluminum or an alloy thereof is completely etched. Under ideal conditions, an anisotropic etch is achieved, i.e. the sidewalls of the etched material are vertical, thus retaining the integrity of the fine pattern of the plasma etch mask.

While ion bombardment is necessary for effective anisotropic etching, etching on the sidewalls of etched material will take place if the lifetime of the adsorbed reactive atoms is sufficiently long. The chlorine-containing gases commonly utilized to etch aluminum or its alloys, i.e. boron trichloride alone or in combination with chlorine or chlorine plus helium, provide such long-lived reactive atoms in the glow discharge. These atoms will cause undercutting of the aluminum on the sidewalls, under the plasma resist mask. This is a significant disadvantage in the production of VLSI devices.

It will be appreciated that the degree of undercutting of aluminum is related to both the length of time the reactive atoms are in contact with the aluminum and, more importantly, their concentration. In conventional glow discharge systems, plasma etching as described herein takes place on a conventional substrate from the edges or periphery toward the center. This is true for a single substrate or wafer being etched. Where two wafers are etched in close proximity, etching proceeds in a manner such that the last portion to be etched will be along the radial lines to the point of the common tangent.

The reason etching occurs in such a manner is that the electric field strength is greatest at the edge of the substrate or wafer. The electric field is more concentrated at the periphery of the substrate than at the center. This causes the reactive gases to be depleted toward the center. The result of this phenomenon is radial nonuniformities in the etching of the substrate. This causes significant overetching at the periphery of the substrate by the time etching is completed in the center.

In accordance with this invention, there is provided a means of reducing the concentration of reactive ions at the periphery of the substrate or substrates. By reducing the concentration of reactive ions at the periphery, there is provided a remarkably improved uniformity of etch across the substrate. This is accomplished in accordance with this invention by placing the substrate on a getter plate or sheet which extends beyond the edges of the substrate.

Kaganowicz in copending application Ser. No. 260,164, filed May 4, 1981 discloses a method of overcoming the edge effect in coating by glow discharge. The edge effect is defined as nonuniformities in thickness and other properties in a glow discharge deposited coating which are found to occur at the outer edge. Kaganowicz extends the edge of the substrate to be coated sufficiently beyond the area to be coated so that the target area receives a substantially uniform coating.

Kaganowicz further states that the nonuniformities observed for a glow discharge deposited coating should also occur during plasma assisted reactive etching. The method of Kaganowicz, however, has little if any effect in the problem of the significant undercutting of aluminum being reactive sputter etched which occurs at the periphery. This is apparent from the significant undercutting which takes place at the periphery of an aluminum substrate etched on a large support of a conventional material such as aluminum oxide. However, by the use of a getter plate in accordance with this invention, a substantially uniform etch is achieved with significantly reduced undercutting at the periphery.

Although it is not essential that the getter plate have the same shape as the substrate, it is preferred that they have substantially the same shape. It is essential to this invention that the getter plate extend outwardly from the edges of the substrate for a distance sufficient to cause substantially uniform etching across the substrate. Generally, the extension of the getter plate should be at least one-sixth, preferably one-third of the particular length of the substrate in order to prevent significant undercutting of the aluminum at the periphery. This extension would, of course, be divided equally between opposite edges of the substrate. For example, a round substrate three inches in diameter should be placed on a metal getter plate at least 3.5 inches and preferably four inches in diameter.

The getter plate is comprised of any metal or alloy which has an affinity for the reactive atoms generated in the glow discharge. Suitable metals include stainless steel, molybdenum, tantalum, nickel, tungsten and gold. Preferred among these is tantalum. Generally, only a thin sheet, e.g. 0.062 inches thick, of the getter is required. The thickness of the plate is not critical to this invention.

The method of this invention is preferably carried out in a conventional parallel plate reactor. In such apparatus, the getter plate is placed on the lower electrode and the substrate placed thereon. The method of this invention produces a significant increase in the uniformity of etch across an aluminum or aluminum alloy substrate utilizing boron trichloride alone or in combination with chlorine or chlorine plus helium. A further improvement in uniformity of etch can be realized in accordance with this invention by adding to the etchant gas a small quantity, i.e. from about $1.0 \times 10^{-6}$ to about $3.5 \times 10^{-6}$ percent by volume, based on the etchant gas mixture, of a gaseous hydrocarbon which will polymerize under conditions of glow discharge. Preferred gaseous hydrocarbons are ethylene, cyclopropane or mixtures thereof.

The addition of such gaseous hydrocarbons to an aluminum etchant gas mixture to increase uniformity of etch and reduce undercutting is disclosed and claimed in U.S. patent application, Ser. No. 362,041, filed concurrently herewith in the names of Vossen and Halon. The disclosure of that application is incorporated herein by reference. It has been found in accordance with this invention that even greater uniformity of etch is achieved by utilizing etchant gas mixtures such as disclosed in said application with the herein described getter plate.

The following Example further illustrates this invention, it being understood that the invention is in no way intended to be limited to the details described therein. In the Example, all parts and percentages are on a weight basis and all temperatures are in degrees Celsius, unless otherwise stated.

EXAMPLE

One millimicron thick aluminum coated silicon wafers three inches in diameter were utilized as substrates. The wafers were overcoated with a finely patterned resist layer. The line width in the pattern was 10 micrometers. The wafers were placed in groups of two into a parallel electrode etching reactor.

A first group of two substrates served as a control. These substrates were etched with a mixture of boron trichloride and chlorine in a partial pressure ratio of 96.5:3.5. The pressure was 250 mtorr and the total etchant gas flow was 100.5 sccm. The reaction chamber was operating at 13.56 Mc.

A second group of two substrates was placed on a tantalum disc 4 inches in diameter and etched in a similar manner utilizing the same etchant gas mixture.

A third group of two substrates was placed on similar tantalum discs and etched in a similar manner with the addition of $1.7 \times 10^{-6}$ percent by volume of cyclopropane to the etchant gas mixture. The results of these etching runs are plotted in the FIGURE.

It can be seen from the FIGURE that the etch is in no instance totally uniform across the surface of a 3 inch (72 mm) substrate. It is clear that the use of the getter surface of tantalum provides a significantly more uniform etch with materially reduced undercutting. It is also clear from the FIGURE that the uniformity of etch is even further improved by the addition of cyclopropane to the etchant mixture.

I claim:

1. In a process of plasma etching a substrate of aluminum or an alloy thereof with an etchant gas containing boron trichloride, the improvement comprising supporting the substrate on a metal getter plate which extends outwardly from the edges of the substrate for a distance sufficient to cause substantially uniform etching across the substrate having improved uniformity.

2. A process in accordance with claim 1, wherein the substrate and the getter plate have substantially the same shape.

3. A process in accordance with claim 2, wherein the substrate and the getter plate are in the shape of a disc and the diameter of the getter plate is at least about one-sixth greater than that of the substrate.

4. A process in accordance with claim 3, wherein the diameter of the getter plate is about one-third greater than that of the substrate.

5. A process in accordance with claim 1, wherein the metal of the plate is selected from the group consisting of tantalum, stainless steel, molybdenum, nickel, tungsten and gold.

6. A process in accordance with claim 5, wherein the metal is tantalum.

7. A process in accordance with claim 1, wherein said etchant gas contains a gaseous hydrocarbon which will polymerize under conditions of glow discharge in an amount effective to reduce undercutting.

8. A process in accordance with claim 7, wherein said gaseous hydrocarbon is selected from the group consisting of ethylene, cyclopropane and mixtures thereof.

9. A process in accordance with claim 8, wherein said gaseous hydrocarbon is cyclopropane.

* * * * *